(12) United States Patent
Wu

(10) Patent No.: US 9,741,796 B2
(45) Date of Patent: Aug. 22, 2017

(54) GRAPHENE-BASED VALLEY FILTER AND METHOD FOR OPERATING THE SAME

(71) Applicant: NATIONAL TSING HUA UNIVERSITY, Hsinchu (TW)

(72) Inventor: Yu-Shu Wu, Hsin-Chu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 46 days.

(21) Appl. No.: 14/859,353

(22) Filed: Sep. 20, 2015

(65) Prior Publication Data

US 2017/0084698 A1    Mar. 23, 2017

(51) Int. Cl.
| | | |
|---|---|---|
| *H01L 29/16* | (2006.01) |
| *H01L 29/06* | (2006.01) |
| *H01L 29/786* | (2006.01) |
| *H03H 11/04* | (2006.01) |

(52) U.S. Cl.
CPC ...... *H01L 29/1606* (2013.01); *H01L 29/0673* (2013.01); *H01L 29/78684* (2013.01); *H03H 11/04* (2013.01)

(58) Field of Classification Search
CPC ............. H01L 29/1606; H01L 29/0673; H01L 29/78684; H03H 11/04
USPC .................................. 327/552–559; 977/730
See application file for complete search history.

(56) References Cited

U.S. PATENT DOCUMENTS

| | | | | | |
|---|---|---|---|---|---|
| 8,294,132 | B2* | 10/2012 | Miao | ........................ | H01L 45/08 257/1 |
| 8,624,223 | B2* | 1/2014 | Chen | ........................ | H01L 29/78 257/20 |
| 9,293,536 | B2* | 3/2016 | Nourbakhsh | ....... | H01L 29/1606 |
| 9,466,686 | B2* | 10/2016 | Chen | ................... | H01L 29/4908 |

OTHER PUBLICATIONS

Yu-Shu Wu et al., "Graphene Quantum Wires for All-electrically Driven Valley Filters and Valley Valves", Tuesday, Sep. 23, 2014 RPGR, Taipei, Room A, TA2-01.

* cited by examiner

*Primary Examiner* — Dinh T Le
(74) *Attorney, Agent, or Firm* — CKC & Partners Co., Ltd.

(57) ABSTRACT

A graphene-based valley filter includes a bottom gate, a bilayer graphene and two top gates. The bilayer graphene is deposited on the bottom gate and includes scattering defects. The top gates are deposited on the bilayer graphene. The top gates define a channel in the bilayer graphene, and the scattering defects are located in the vicinity of the channel. A vertical electric field is formed to open a band gap and produce electronic energy subbands in the channel. A transverse in-plane electric field is formed to produce pseudospin splitting in the subbands of the bilayer graphene. The scattering defects are for producing scattering between two opposite energy valley states of the bilayer graphene, couples subband states of opposite pseudospins and opens a pseudogap at a crossing point of the two subbands. Electrons are passed through the channel to become valley polarized in the bilayer graphene.

11 Claims, 11 Drawing Sheets

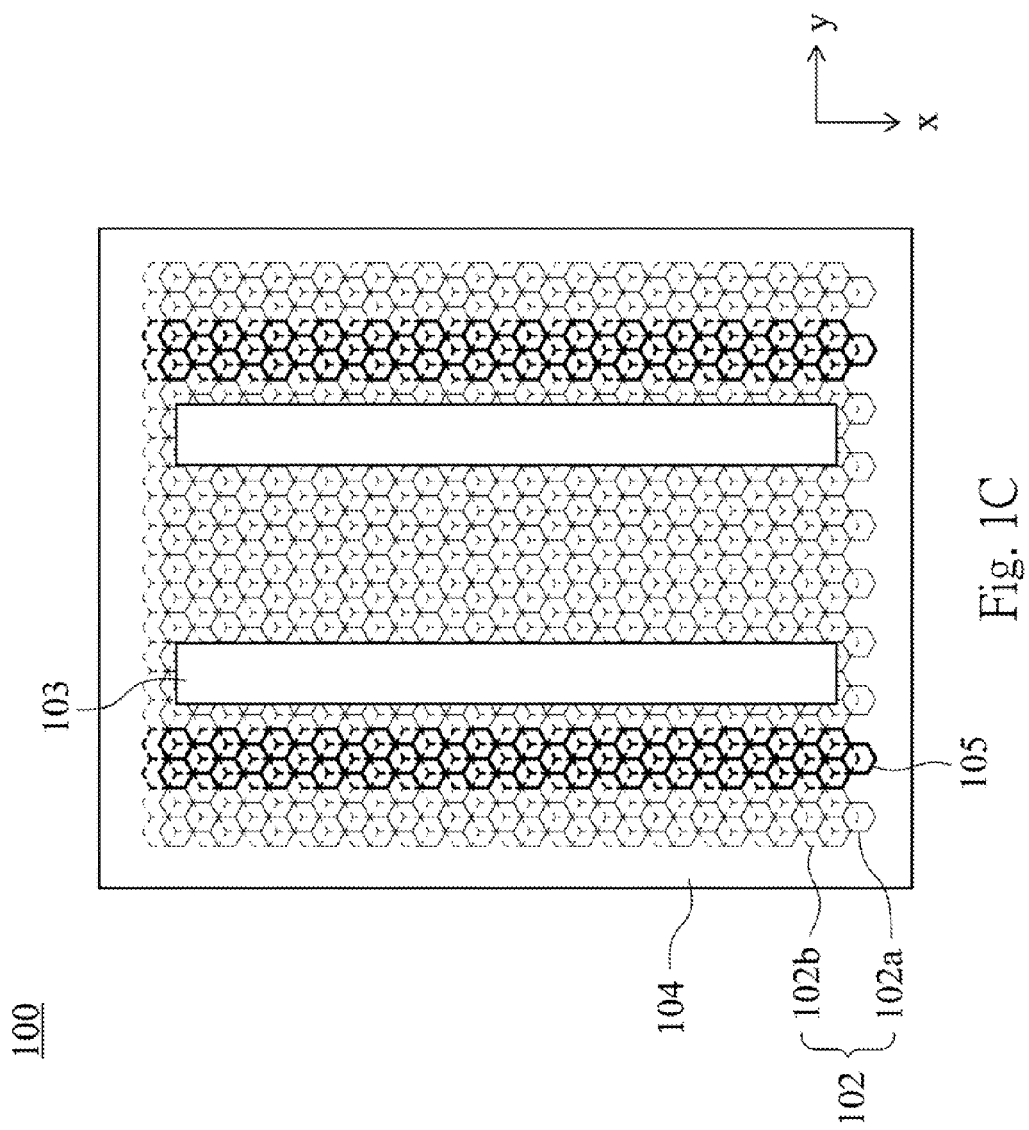

GRAPHENE-BASED VALLEY FILTER AND METHOD FOR OPERATING THE SAME

BACKGROUND

Technical Field

The present disclosure relates to semiconductor devices, especially a graphene-based valley filter which is capable of switching valley polarizations through electrical gate control.

Description of Related Art

Graphene has many extraordinary properties and has been considered as a promising future material. Graphene has mechanical strength about 200 times stronger than steel, and conducts heat and electricity with great efficiency. Furthermore, it is also identified to have advantageous electrical properties such as bipolar transistor effect, ballistic transport of charges and large quantum oscillations. Carrier mobility of Graphene sheets may be greater than 200,000 $cm^2$/V-sec at 4K and as high as 15,000 $cm^2$/V-sec even in 300K. Thus it opens a great potential on manufacturing high speed electronic devices.

Structurally, graphene is an allotrope of carbon in the form of a two-dimensional, one atomic layer thin, hexagonal lattice in which every atom occupies a vertex. Graphene has hybrid orbitals formed by $sp^2$ hybridization. The 2s orbital and two of the three 2p orbitals are mixed to form three $sp^2$ orbitals. The one remaining p-orbital forms a pi ($\pi$)-bond between the carbon atoms. Fundamentally, the electronic properties of graphene are dictated by the bonding and anti-bonding orbitals (giving respectively the valance and conduction bands) derived from these p-orbitals.

Some unusual properties of graphene may lead to difficulties in manufacturing desired electronic devices. For example, a graphene sheet has a zero bandgap with linear energy-momentum relation for carriers in its nature state. This makes it impossible to produce electric charge switching effect in graphene as a conventional transistor. Therefore, opening bandgap in graphene remains a main challenge before making it into a switching semiconductor device such as FET (Field-Effect Transistor).

Moreover, it has been established recently that, in addition to charge and spin, electrons in graphene also have a valley pseudospin degree of freedom that can be exploited to create valleytronic devices. This property is derived from the existence of multiple minima (maxima) of conduction (valence) bands in momentum space. Generally speaking, promising systems to explore the valley-related properties are two-dimensional honeycomb lattices including gapped graphene systems and monolayer transition metal dichalcogenides.

Probing and controlling the valley degree of freedom in graphene systems by transport measurements has been a major challenge to fully exploit the unique properties of this two-dimensional material.

Central to valleytronic applications are the devices that generate valley-polarized electrons for valleytronic signal processing. The first experimental demonstration of valley polarization was achieved by optical pumping with circularly polarized light in monolayer $MoS_2$ by using the valley-contrasting selection rules for optical transitions in the K and K' valleys. On the other hand, possible electrical valley filters in graphene systems have been proposed with filtering mechanisms based on, for example, the valley dependence of quantized states in a zigzag graphene nanoribbon, the valley-dependent electron scattering at a line defect, breaking the valley symmetry by employing strain and magnetic field simultaneously or an AC external field, and utilizing the energy band warping. Experimental implementation is not yet reported for various reasons: some of the proposed configurations could not be easily constructed in the laboratory, may not have switchable polarity, or require the presence of magnetic fields. Hence it leaves plenty of room for further improvement in order to make valleytronics a foreseeable reality.

From the application point of view, it is highly desirable to integrate the valleytronic components with conventional electronic components (e.g., integrated electrovalleytronics). This approach allows for the application to take full advantage of each component's unique performance, for example, using electronic devices for storage units to circumvent the valley decoherence problem in valleytronic devices, and using valleytronic devices for processing units to mitigate the power consumption problem in downscaling integrated circuits.

SUMMARY

According to one aspect of the present disclosure, a graphene-based valley filter is disclosed. The graphene based valley filter includes a bottom gate, a bilayer graphene and two top gates. The bilayer graphene is deposited on the bottom gate, and the bilayer graphene includes scattering defects. The top gates are deposited on the bilayer graphene. The two top gates define a channel in the bilayer graphene, and the scattering defects are located, in the vicinity of the channel. Wherein a vertical electric field is formed between the bottom gate and the top gates to open a band gap as well as produce electronic energy subbands in the bilayer graphene channel, a transverse in-plane electric field is formed between the top gates to produce pseudospin splitting in the energy subbands of the bilayer graphene channel, the scattering defects are configured to produce a scattering between two energy valley states with opposite pseudospins in the bilayer graphene, couple subband states of opposite pseudospins and open a pseudogap at a crossing point of the two subbands and electrons are passed through the channel to become valley polarized in bilayer graphene.

According to another aspect of the present disclosure, a method for operating a graphene based valley filter is disclosed. The method includes: a vertical electric field is applied across a bilayer graphene to open bandgaps in the bilayer graphene, wherein the bandgap's presence defines a channel of electron transport in bilayer graphene and results in the formation of energy subbands in the channel; a transverse in-plane electric field is applied across the bilayer graphene to produce pseudospin splitting in the subbands of the bilayer graphene; two energy valley states with opposite pseudospins in the bilayer graphene are scattered into each other by scattering defects formed on the bilayer graphene, and subband states of opposite pseudospins are coupled to open a pseudogap at a crossing point of the two subbands; electrons are passed through a channel in the bilayer graphene to generate valley polarization; and the valley polarization is switched by reversing the transverse in-plane electric field.

According to still another aspect of the present disclosure, a graphene-based valley filter is disclosed. The graphene-based valley filter includes a bottom gate, a boron nitride layer, a monolayer graphene and two top gates. The boron nitride layer is deposited on the bottom gate. The graphene layer is deposited on the boron nitride layer, wherein the graphene layer includes scattering defects. The two top gates are deposited on the graphene, wherein the two top gates define a channel in the graphene layer/boron nitride layer structure, and the scattering defects are located in the vicinity of the channel. Wherein a vertical electric field is formed between the bottom gate and the top gates to produce electronic energy subbands in the graphene layer, a transverse in-plane electric field is formed between the top gates to produce pseudospin splitting in die energy subbands of the graphene layer, the scattering defects are configured to produce a scattering between two energy valley states with opposite pseudospins in the graphene layer, couple subband states of opposite pseudospins and opens a pseudogap at a crossing point of the two subbands, and electrons are passed through the channel to become valley polarized in the graphene layer.

BRIEF DESCRIPTION OF THE DRAWINGS

The present disclosure can be more fully understood by reading the following detailed description of the embodiment, with reference made to the accompanying drawings as follows:

FIG. 1C is a top view of the graphene-based valley filter of FIG. 1A;

DETAILED DESCRIPTION

Figure 1A:
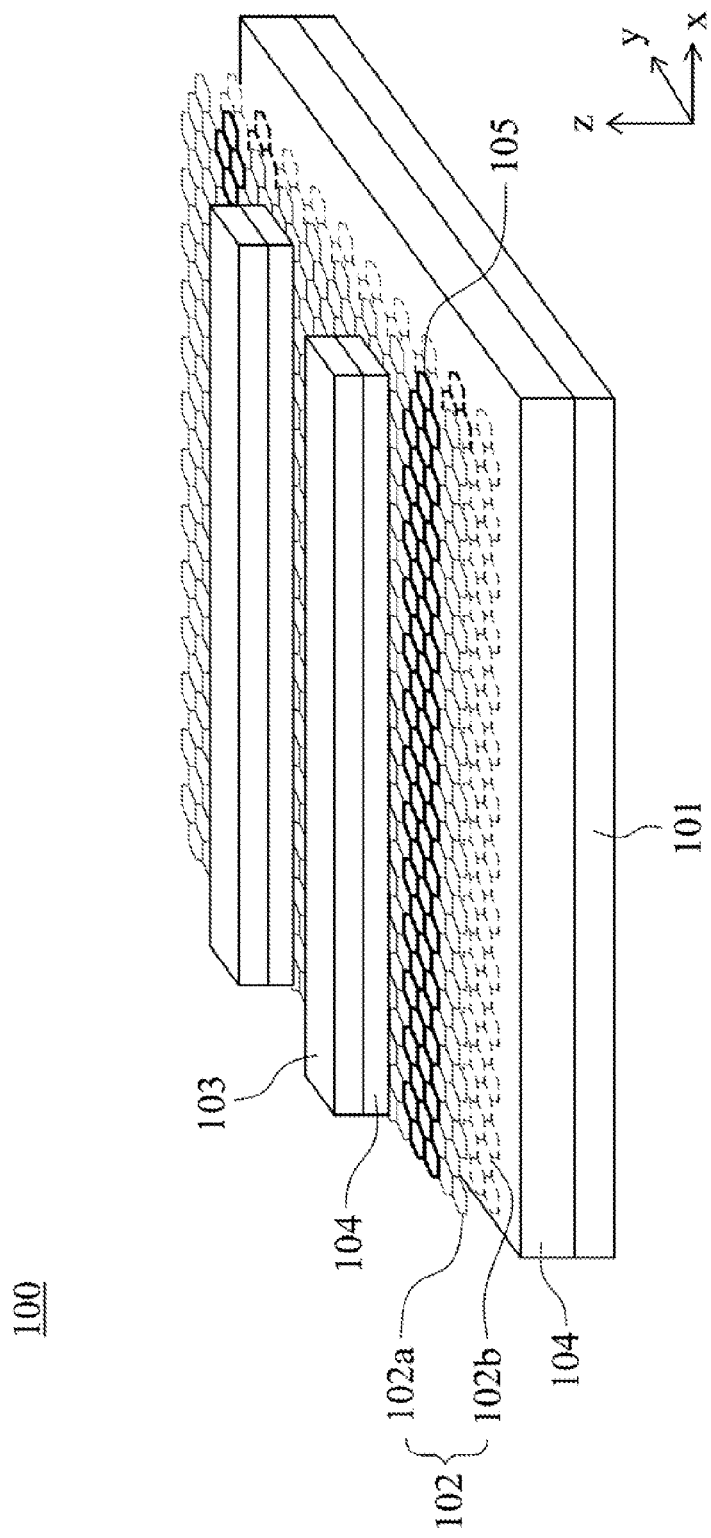
FIG. 1A is a schematic view showing a graphene-based valley filter according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

The present disclosure provides a graphene-based valley filter in which a valley filtering is accomplished by the combination of: opening bandgap in a bilayer graphene with a vertical electrical field; shifting valley-dependent subbands with a transverse in-plane electric field; and lifting degeneracy by boundary scattering. The graphene-based valley filter of the present disclosure can function as a building block for valleytronics, and can be capable of converting signals between electrical and valleytronic forms, thereby leading to integration of electronic and valleytronic components.

Figure 1B:
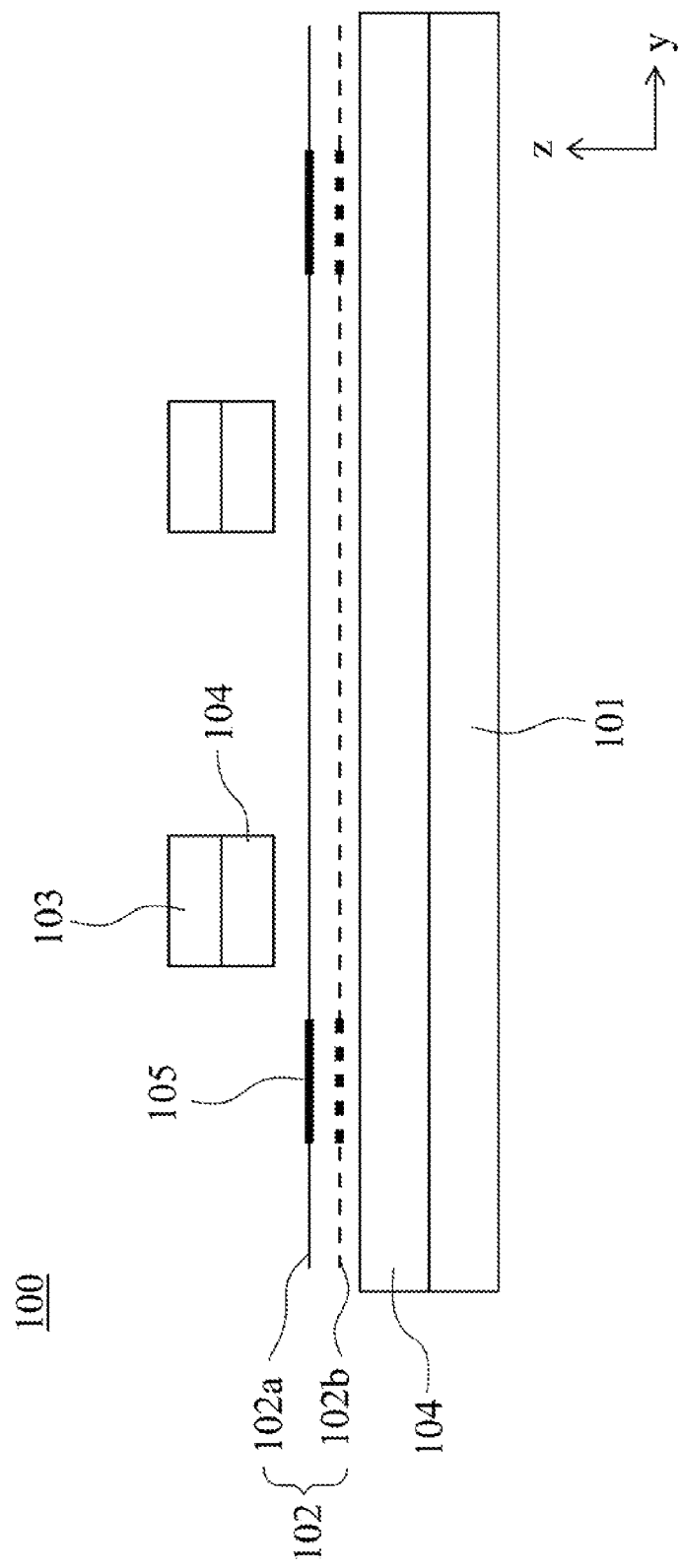
FIG. 1B is a cross-sectional view of the graphene-based valley filter of FIG. 1A.

FIG. 1A is a schematic view showing a graphene-based valley filter 100 according to one embodiment of the present disclosure; FIG. 1B is a cross-sectional view of the graphene-based valley filter 100 of FIG. 1A; and FIG. 1C is a top view of the graphene-based valley filter 100 of FIG. 1A.

The graphene-based valley filter 100 includes a bottom gate 101, a bilayer graphene 102 and two top gates 103. The bilayer graphene 102 is deposited on the bottom gate 101, and the bilayer graphene 102 includes a plurality of scattering defects 105 formed thereon. In more details, the two top gates 103 define a channel in the bilayer graphene 102, and the scattering defects 105 are formed in the vicinity of the channel. The scattering defects 105 can be formed by various methods. For example, the scattering defects 105 can be formed by rough edges of the bilayer graphene 102 in the vicinity of the channel or by performing on implantation to the bilayer graphene 102 in the vicinity of the channel. The scattering defects 105 can also be formed from graphene oxide in the vicinity of the channel.

The channel is in the form of a quantum wire or a nanoribbon. In more detail, the quantum wire or the nanoribbon is formed by arranging graphene unit cell along a straight line direction. Furthermore, the scattering defects 105 are formed along the edges of the channel.

The bilayer graphene 102 includes a first layer 102a and a second layer 102b. The first layer 102a is stacked on the second layer 102b with a normal stacking distance, and the second layer 102b is rotated with respect to the first layer 102a by a specified angle. This kind of stacking structure is the so-called A-B Bernal stacking. In one embodiment, the bilayer graphene 102 can be replaced by depositing monolayer graphene on a boron nitride layer. For example, the monolayer graphene can be deposited on the hexagonal boron nitride layer in the same form of A-B Bernal stacking to form a graphene layer/boron nitride layer structure similar as the bilayer graphene 102.

Figure 2:
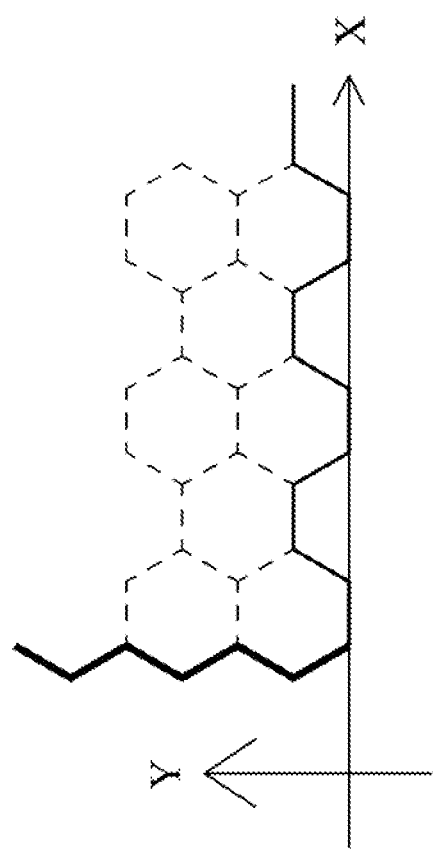
FIG. 2 is a schematic view showing an arrangement of graphene unit cells for defining a channel in the bilayer graphene.
Figure 3:
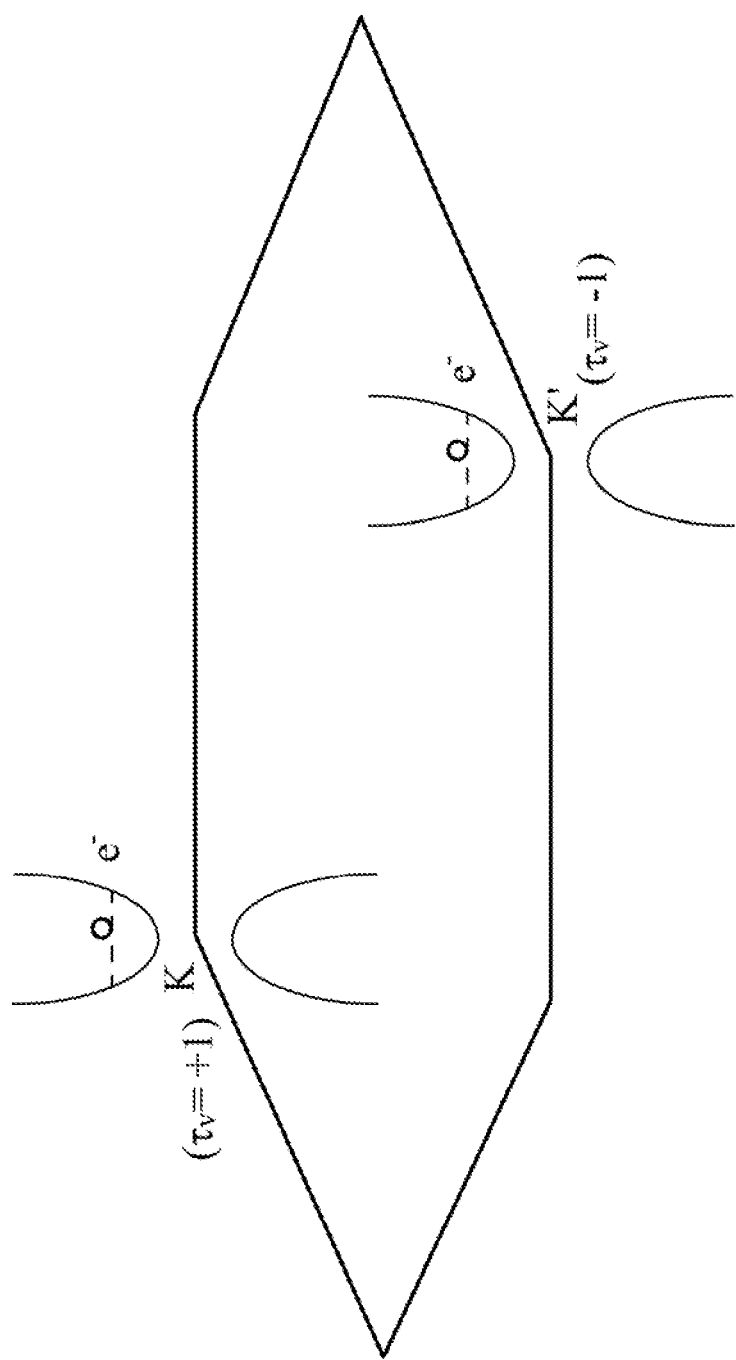
FIG. 3 is a schematic view showing two energy valley states of the graphene unit cell of FIG. 2.

FIG. 2 is a schematic view showing an arrangement of graphene unit cells for defining a channel in the bilayer graphene. FIG. 3 is a schematic view showing two energy valley states of the graphene unit cell of FIG. 2.

In FIG. 2, a plurality of graphene unit cells are arranged along x-axis direction. Each of the graphene unit cells has hexagonal structure of a 3-way bonding between carbon atoms. The aforementioned channel is a region located within the two top gates 103, and is defined by connecting the graphene unit cells, in FIG. 2, when connecting the graphene unit cells, an armchair structure can be observed along x-axis direction, and a zigzag structure can be observed along y-axis direction. Moreover, the channel is configured for allowing electrons passing through along x-axis direction.

In FIG. 3, it is shown that in a graphene unit cell, a graphene electron can be in either K or K' valleys of the Brillouin zone, giving rise to the existence of valley pseudospin in graphene and the possibility of developing the so-called valleytronics. Intrinsically, time reversal symmetry results in the energy degeneracy of K and K' valleys in Brillouin Zone. A valley pseudospin index $\tau=\pm$ is introduced for K/K'.

Figure 4:
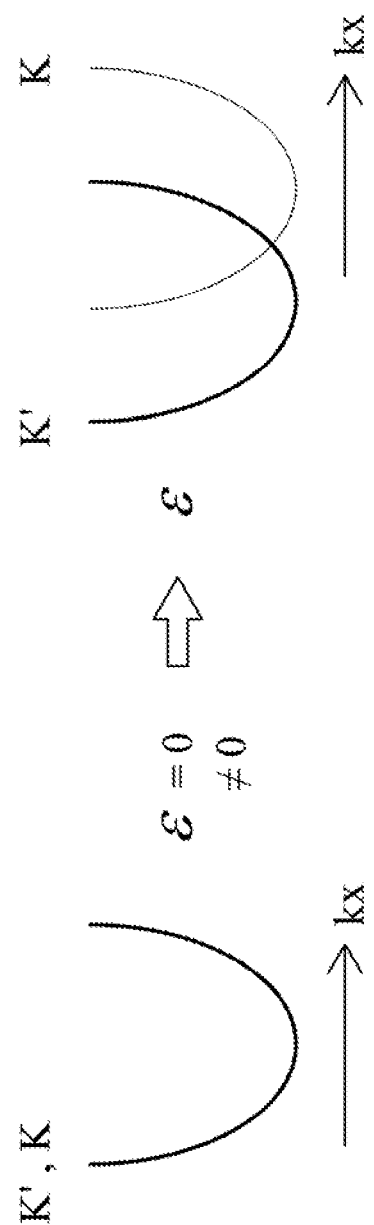
FIG. 4 is a schematic view showing split subbands in a graphene after applying a transverse in-plane electric field.

FIG. 4 is a schematic view showing split valley-dependent subbands in a graphene after applying a transverse in-plane electric field. In FIG. 4, subbands for K/K' are overlapped due to energy degeneracy when no external source exists. When applying a transverse in-plane electric field ε (ε is parallel to Y axis direction), subband splittings for K or K' valleys are observed.

Figure 5:
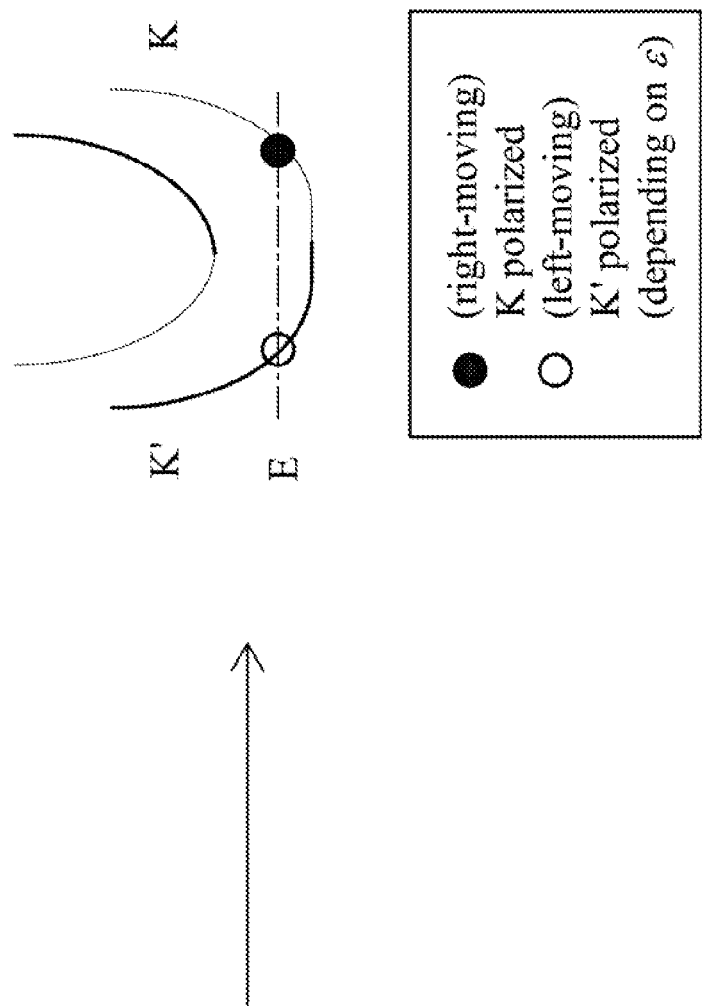
FIG. 5 is a schematic view showing valley polarizations generated with a transverse in-plane electric field and intervalley state scattering.

FIG. 5 is a schematic view showing valley polarizations generated with a transverse in-plane electric field and intervalley state scattering. In FIG. 4, the transverse in-plane electric field ε is formed between the two top gates 103 to produce pseudospin splitting in the subbands of the bilayer graphene. Then in FIG. 5, the scattering defects 105 are configured to produce an intervalley K↔K' scattering between the two energy valley states K and K', couple subband states of opposite pseudospins and open a pseudogap at the crossing point of the two subbands. When a small bias is applied along the x-direction, an electron can be driven to transport in the channel. And for the passing electron to become valley polarized, its corresponding electronic energy level must be inside the pseudogap, which intersects the subbands at two points, corresponding to left- and right-moving electron states, respectively. Since these two states carry primarily opposite pseudospins, valley polarization can be generated by placing the Fermi level E in the pseudogap. The polarity of valley polarization can be switched by reversing either the moving direction of the electron, or the direction of the transverse in-plane electric field ε.

According to one embodiment, a method for operating the graphene-based valley filter is provided. The method includes: a vertical electric field is applied across a bilayer graphene to open bandgaps in the bilayer graphene, wherein the bandgaps define the channel of electron transport in the bilayer graphene and lead to the formation of electronic energy subbands in the channel; a transverse in-plane electric field is applied across the bilayer graphene to produce pseudospin splitting in the subbands of the bilayer graphene; two energy valley states K and K' of the bilayer graphene are scattered into each other by scattering defects formed on the bilayer graphene, and subband states of opposite pseudospins are coupled thereby opening a pseudogap at the crossing point of the two subbands; electrons are passed through a channel in the bilayer graphene to generate valley polarizations; and the valley polarizations are switched by reversing the transverse in-plane electric field.

In the following section, the detailed operating mechanisms of the valley filter in the present disclosure are explained by utilizing theoretical calculations.

Valley-Orbit Interaction (VOI)

The novel mechanism exploited is the so-called valley-orbit interaction (VOI) that couples the valley pseudospin to an in-plane electric field. The VOI exists in gapped graphene and is similar to the Rashba spin-orbit interaction (SOI), but with a significant difference. The VOI in monolayer graphene is given by:

$$H_{VOI} = \tau \frac{\hbar}{4m\Delta}(\nabla V \times p) \cdot z,$$

which is valley conserving (τ=± being the valley index for K/K', 2Δ energy gap, m=electron effective mass, V=potential energy, p=momentum operator, z=unit vector normal to the graphene plane).

Therefore, the VOI does not induce the flip-type scattering. A similar effect but with a more complex expression also exists in bilayer graphene.

The Electron Transport Through the Channel of the Graphene-Based Valley Filter

The mechanism of the electron transported through the channel of the graphene-based valley filter in the present disclosure can be explained as follows. To a lowest-order approximation, the channel length is assumed to be infinite, the electronic energy subband structure in the channel is calculated while taking into account scattering defects, and the electron transport in the channel based on the subband structure is discussed. A linearized, four-component continuum theory is used for the subband structure calculation. A tight-binding calculation is also carried out to confirm that the continuum theory is a good approximation for the energy range of interest in the present disclosure. The Hamiltonian can be represented by:

$$H_{\pm}\Psi_{\pm} = E\Psi_{\pm}$$

$$\Psi_{\pm}(\vec{r}) = (\phi_{A1}^{(\pm)}(\vec{r})\phi_{B1}^{(\pm)}(\vec{r})\phi_{A2}^{(\pm)}(\vec{r})\phi_{B2}^{(\pm)}(\vec{r}))^1, \quad (1)$$

where $H_{\pm}$ is the Hamiltonian, and $\Psi_{\pm}$ is the envelope wave function. Here, the subscript or superscript "+" ("−") denotes the K (K') valley, with the corresponding wave vector given by $$\vec{K} = \left(0, \frac{-4\pi}{3\sqrt{3}\,a_0}\right) \left(-\vec{K} = \left(0, \frac{4\pi}{3\sqrt{3}\,a_0}\right)\right)$$

for the K (K') point, and $a_0$=1.42 Å is the inter-carbon distance.

The four components in $\Psi_{\pm}$ refer to the wave amplitudes on the four atoms (A1, B1, A2, and B2) in a bilayer graphene unit cell. The Hamiltonian $H_{\pm}$ for bilayer graphene can be represented by:

$$H_{\pm} = \begin{pmatrix} -\Delta + V & iv_F \hat{p}_{\mp} & 0 & \gamma_1 \\ -iv_F \hat{p}_{\pm} & -\Delta + V & iv'\hat{p}_{\mp} & 0 \\ 0 & -iv'\hat{p}_{\pm} & \Delta + V & iv_F \hat{p}_{\mp} \\ \gamma_1 & 0 & -iv_F \hat{p}_{\pm} & \Delta + V \end{pmatrix}, \quad (2)$$

$$\hat{p}_{\pm} = i\hbar(\partial_x \pm i\partial_y),$$

$$v_F = \frac{3\gamma_0 a_0}{2\hbar}, v' = \frac{3\gamma_3 a_0}{2\hbar}.$$

Here γ0, γ1, and γ3 are the tight-binding parameters representing various hopping energies, 2Δ is the chemical potential difference between the layers due to the gate biases applied, and V is the potential energy due to the transverse in-plane electric field. V and Δ in the Hamiltonian are determined by the various gate biases and are both modeled with piecewise constant functions described below.

Figure 6:
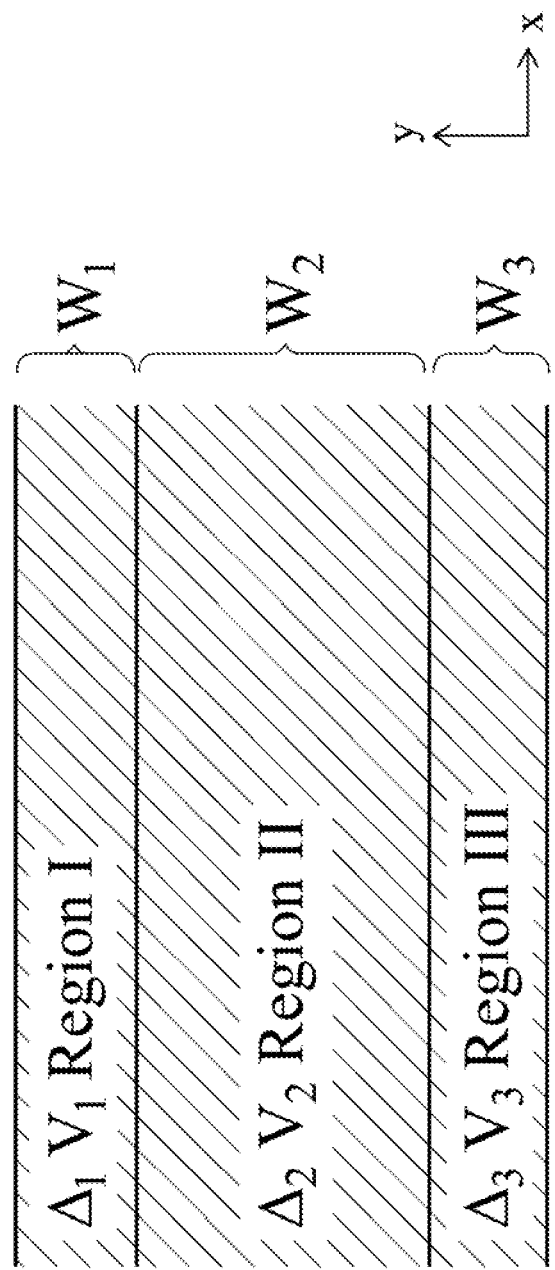
FIG. 6 is a schematic view showing a configuration of a channel in the graphene-based valley filter of the present disclosure.

FIG. 6 is a schematic view showing a configuration of a channel in the graphene-based valley filter of the present disclosure. As depicted in FIG. 6, the device is divided into three regions, with the middle region ($-W_2/2 < y < W_2/2$) being the quantum wire channel and the boundaries given by $y = W_1 + W_2/2$ and $y = -W_2/2 - W_3$ are where the scattering defects located. Therefore, four regions are taken into consideration:

Region I ($W_2/2 < y < W_1 + W_2/2$): $\Delta(\vec{r}) = \Delta_1$, $V(\vec{r}) = V_1$.

Region II-1 ($0 < y < W_2/2$): $\Delta(\vec{r}) = \Delta_2$, $V(\vec{r}) = V_1$.

Region II-2 ($-W_2/2 < y < 0$): $\Delta(\vec{r}) = \Delta_2$, $V(\vec{r}) = V_3$.

Region III ($-W_2/2-W_3<y<-W_2/2$): $\Delta(\vec{r})=\Delta_3$, $V(\vec{r})=V_3$.

The difference between $V_1$ and $V_3$ gives an in-plane electric field transverse to the wire, which is modeled with a step potential in Regions II-1 and II-2 given above. The boundaries $y=W_1+W_2/2$ and $y=-W_2/2-W_3$ (defect lines are taken to be the edges of graphene oxide. It is known that the oxidation in graphene consumes π electrons and, therefore, given that the conduction and valence bands in graphene are derived from π-electron states, the presence of oxide edges here leads to a hard-wall boundary condition for the electron wave function at $y=W_1+W_2/2$ and $y=-W_2/2-W_3$.

Now solving Eqn. (1) for a given $k_x$, the wave vector along the channel. Due to time reversal symmetry, the solutions to Eqn. (1) for the two valley pseudospins are doubly degenerate. Therefore, the total wave function is generally of the form $$\Psi(\vec{r})=[e^{i\vec{K}\cdot\vec{r}}\Psi_+(\vec{r})+e^{-i\vec{K}\cdot\vec{r}}\Psi_-(\vec{r})]. \qquad (3)$$

A mixed state of the two degenerate solutions. In view of V and Δ both being piecewise constant, we proceed as follows.

First, solving for $\Psi(\vec{r})$ in each region of constant potential (labeled by N, N=I, II-1, II-2, and III), as described below. Then calculating, in each region, the bulk complex band structure $E(k_\pm^{(N)}; k_x)$, where $k_\pm^{(N)}$ (with "±" being valley indices) is the y-component of bulk wave vector in the region. In general, $k_\pm^{(N)}$ is a complex number. For a given E and a given $k_x$, there are four bulk solutions for each valley, with $k_\pm^{(N)}$'s and the corresponding wave functions being, respectively, $k_{\pm,j}^{(N)}$ and $$e^{ik_x x} e^{ik_{\pm,j}^{(N)} y} \psi_{\pm,j}^{(N)},$$

for j=1-4, $\Psi_{\pm,j}^{(N)}$ denotes a four-component column vector. Next, a general bulk solution in each region can be represented by:

$$\Psi^{(N)}(\vec{r}) = \left[ e^{i\vec{K}\cdot\vec{r}}\Psi_+^{(N)}(\vec{r}) + e^{-i\vec{K}\cdot\vec{r}}\Psi_-^{(N)}(\vec{r}) \right], \qquad (4)$$

$$\Psi_\pm^{(N)}(\vec{r}) = e^{ik_x x} \sum_{j=1}^{4} c_{\pm,j}^{(N)} e^{ik_{\pm,j}^{(N)} y} \psi_{\pm,j}^{(N)}.$$

Matching the bulk solutions between different regions, and enforcing the hard-wall boundary conditions: $\Psi^{(I)}(\vec{r})=0$ at $y=W_1+W_2/2$ and $\Psi^{(III)}(\vec{r})=0$ at $y=-W_2/2-W_3$; the corresponding subband energy levels can be determined for a given $k_x$, and hence $E(k_x; n)$, the subband structure (n=subband index).

Valley Polarization While Electrons Pass Through the Channel

Figure 7B:
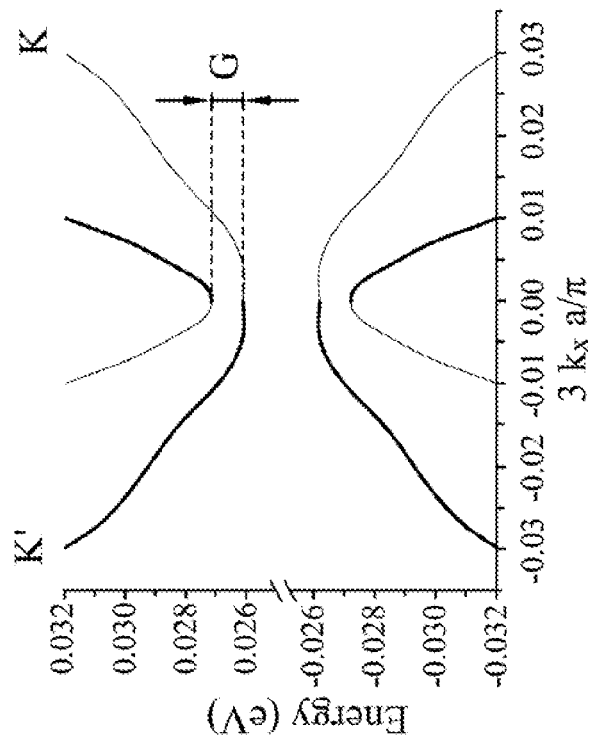
FIG. 7B is a diagram showing the subbands with the effect of scattering defects taken into account.
Figure 7A:
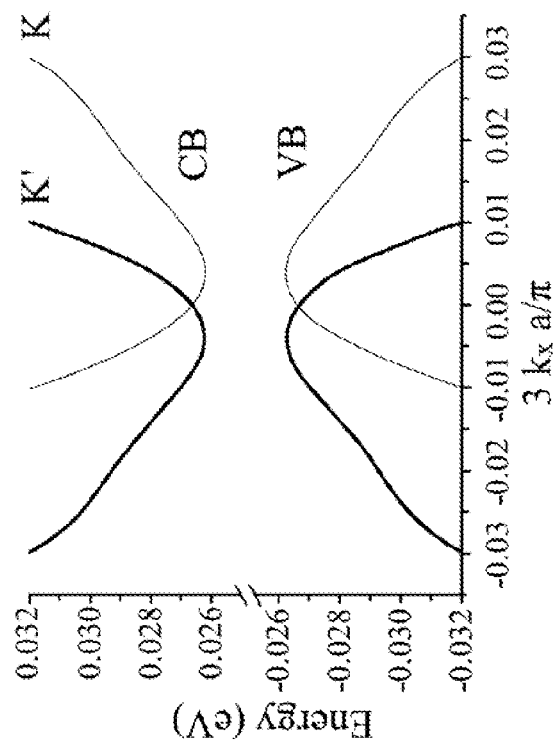
FIG. 7A is a diagram showing the subband dispersion for the corresponding channel with $W_1=W_3=\infty$.

FIG. 7A is a diagram showing the subband dispersion for the corresponding channel with $W_1=W_3=\infty$; FIG. 7B is diagram showing the subbands with the effect of scattering defects taken into account; and FIG. 7C is diagram showing valley polarizations when an electron passing through the specific valley filter.

The valley filter configuration specified by $W_1=W_3=120$ Å, $W_2=100$ Å, $\Delta_1=\Delta_3=100$ meV, $\Delta_2=20$ meV, and $V_1-V_3=70$ meV are considered. In FIG. 7A, the subband dispersion for the corresponding channel (quantum wire) with $W_1=W_3=\infty$ is shown. For example, the scattering defects are located far away from the channel and do not have any effect on the subband dispersion. Due to the difference between $V_1$ and $V_3$, a nonvanishing in-plane electric field is present and breaks the valley degeneracy leading to the Rashba pseudospin splitting, as shown in the figures. With the parameters given here, the energy splitting for $k_x\sim 0.01$ π/3a can reach about 4 meV. In FIG. 7B, the subbands with the effect of scattering defects are taken into account. A pseudogap G of about 1 meV in size is opened due to the scattering-induced coupling between the two pseudospin states.

Figure 7C:
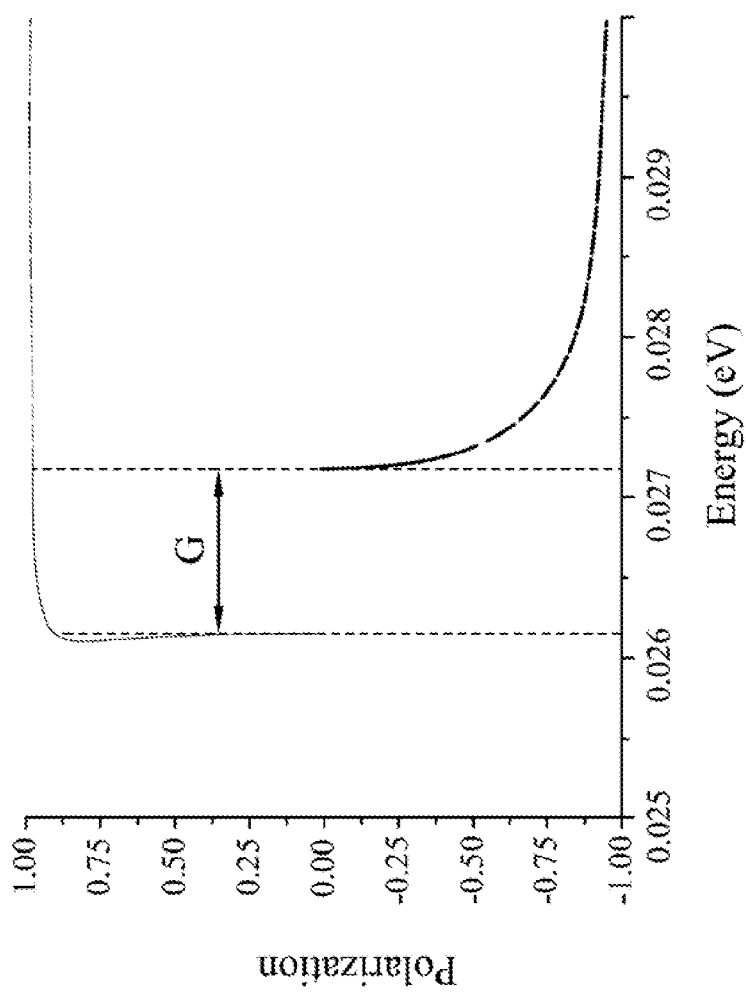
FIG. 7C is a diagram showing valley polarizations when an electron passing through the specific valley filter.

Next, based on the calculation of the subband structure, in FIG. 7C, the valley polarization of an electron passing through the specific valley filter is shown. The corresponding valley polarization can be defined by:

$$P \equiv \frac{P_+ - P_-}{P_+ + P_-}, \quad P_+ \equiv \int d^2r |\Psi_+(\vec{r})|^2, \quad P_- \equiv \int d^2r |\Psi_-(\vec{r})|^2. \qquad (5)$$

where $\Psi_\pm(\vec{r})$ are the two pseudospin components in Eqn. (3). FIG. 7C shows the result of valley polarization vs. electron energy, for right-moving electron states. The polarization vanishes for the electron energy near the bottom of the pseudogap (at 26.2 meV), increases rapidly, and reaches maximum near the top of the pseudogap (at 27.2 meV). For the specific structure considered here, the optimal polarization can reach 97%. It should be noted that this optimal filtering performance can be achieved by placing an additional energy filter in front of the valley filter (e.g., a resonant tunneling structure) that passes only electrons with energy near the top of the pseudogap. The combination of the energy filter and the valley filter provides a set-up for room temperature valley filtering as well, when the energetically filtered electrons are sent right into the valley filter before any energy relaxation process occurs.

Before presenting further numerical results of valley polarization, two useful symmetry-based properties of the polarization are considered. Specifically, the temperature valley filter defined by $W_1=W_3$, $\Delta(y)=\Delta(-y)$ and $V(y)=-V(y)$. Here, V and Δ do not have to be piecewise constant.

Effect of Reversing the In-Plane Electric Field

Considering an electron state in the symmetric structure, with the wave function for a specific $k_x$ being:

$$\Psi(\vec{r})=[e^{i\vec{K}\cdot\vec{r}}\Psi_+(\vec{r})+e^{-i\vec{K}\cdot\vec{r}}\Psi_-(\vec{r})],$$

$$\Psi_+(\vec{r})=e^{ik_x x}(A_1(y)B_1(y)A_2(y)B_2(y),$$

$$\Psi_-(\vec{r})=e^{ik_x x}(A_1'(y)B_1'(y)A_1'(y)B_2'(y). \qquad (6)$$

where $\Psi_\pm(\vec{r})$ satisfies the equation $H_\pm\Psi_\pm(\vec{r})=E\Psi_\pm(\vec{r})$ and $\Psi(\vec{r})$ satisfies the boundary conditions:

$$\Psi(x,y=W_1+W_2/2)=0,$$

$$\Psi(x,y=-W_3-W_2/2)=0.$$

The effect of reversing the in-plane electric field can be investigated by considering a potential U(y) with U(y)=−V(y). It can be verified that, with the reversal, a solution denoted by $\Phi(\vec{r})$ and degenerate with $\Psi(\vec{r})$ (meaning that both have the same wave vector and the same energy) exists and can be represented by:

$$\Phi(\vec{r})=[e^{i\vec{K}\cdot\vec{r}}\Phi_+(\vec{r})+e^{-i\vec{K}\cdot\vec{r}}\Phi_-(\vec{r})],$$

$$\Phi_+(x,y)=\Psi_-(x,-),$$

$$\Phi_-(x,y)=\Psi_+(x,-). \quad (7)$$

Note that the switch of K and K' amplitudes in $\Phi(\vec{r})$, when compared to those in $\Psi(\vec{r})$. In other words, if the original electron state is primarily K-polarized (i.e., $|\Psi_+(\vec{r})|>>|\Psi_-(\vec{r})|$) with valley polarization P, then reversing the field will lead to K'-polarization with the polarization given by −P. This permits us to electrically switch the device between K and K' valley polarization.

Effect of Reversing

It can easily verify that in association with the solution $\Psi(\vec{r})$ in Eqn. (6), there is always a solution:

$$\Theta(\vec{r})=[e^{i\vec{K}\cdot\vec{r}}\Theta_+(\vec{r})+e^{-i\vec{K}\cdot\vec{r}}\Theta_-(\vec{r})],$$

$$\Theta_+(\vec{r})=\Psi_-(\vec{r})^*=e^{-ik_x x}(A_1'(y)^*B_1'(y)^*A_2'(y)^*B_2'(y)^*,$$

$$\Theta_-(\vec{r})=\Psi_+(\vec{r})^*=e^{-ik_x x}(A_1(y)^*B_1(y)^*A_2(y)^*B_2(y). \quad (8)$$

Which is degenerate with $\Psi(\vec{r})$ in energy but with the wave vector being reversed, e.g., $k_x \to -k_x$. As expressed in Eqn. (8), the roles of the valleys are also switched here in comparison to those in $\Psi(\vec{r})$. Therefore, if the state with $k_x$ carries polarization P, then the state with $-k_x$ carries the reversed polarization −P.

The structure parameters can be further modified to increase the operational energy range of the valley filter. For the valley filter configuration in FIG. 6 with parameters specified by $W_1=W_3=40$ Å, $W_2=80$ Å, $\Delta_1=\Delta_3=150$ meV, $\Delta_2=10$ meV, and $V_1-V_3=45$ meV, obtain a large pseudogap ~27 meV can the size of pseudogap being around the room temperature thermal energy, this specific filter alone may be operated at room temperature, when placing the Fermi energy inside the pseudogap. The optimal polarization for this specific geometry can reach about 79% with an energy filter.

Figure 8A:
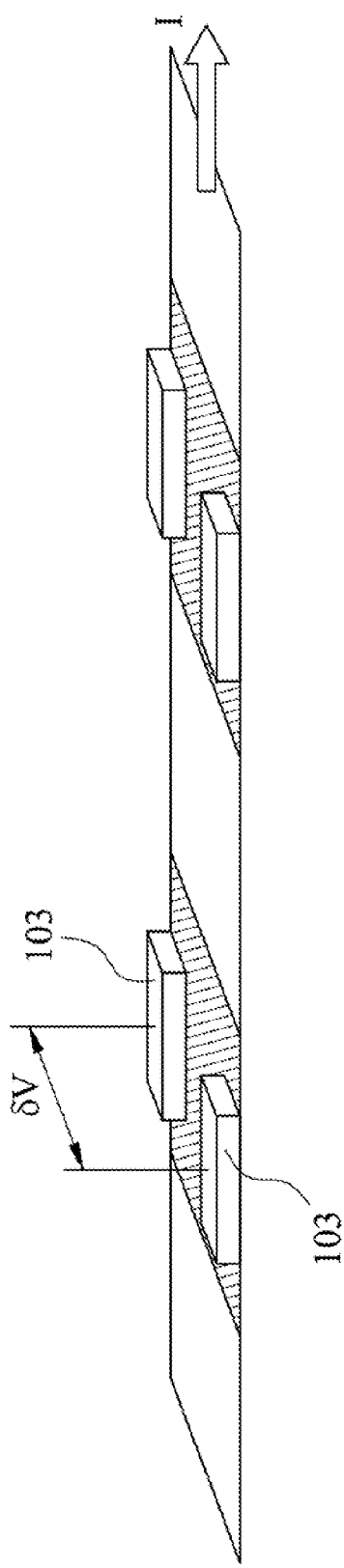
FIG. 8A is a schematic view showing a semiconductor device utilizing the valley filter of the present disclosure.
Figure 8B:
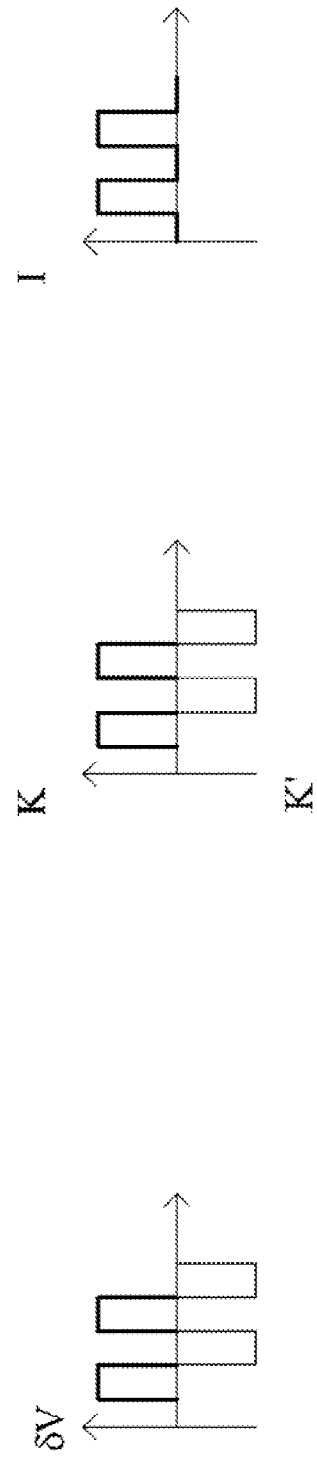
FIG. 8B is a schematic view showing a conversion between a valleytronic current signal and an electric signal.

FIG. 8A is a schematic view showing a semiconductor device utilizing the valley filter of the present disclosure; FIG. 8B is a schematic view showing a conversion between a valleytronic current signal and an electric signal. The time-varying voltage signal sent into the valley filter produces a time-varying in-plane electric field transverse to the channel of the valley filter, and the valley filter outputs a time-varying valley polarized current with polarity varying in phase with the direction of the field. The valley filter is placed in a fixed polarity (e.g., K) mode. The time-varying valleytronic signal suit into the valley filter results in a time-varying output current. The magnitude of the output depends on the polarity of the input current and the polarity set by the filter—a high output if the two are the same and a low output if they are opposite. The output current signal can further be converted into a voltage signal if necessary.

In conclusion, the present disclosure provides a graphene-based valley filter which is constructed by patterning a quantum, wire on bilayer graphene. The graphene-based valley filter has the following features: (a) all electrical gate control; (b) electrically switchable valley polarity, (c) robustness against configuration fluctuation, and (d) potential for room temperature operation. Moreover, a semiconductor device combining two valley filters demonstrates a capability of integrating electronic and valleytronic signal. This result shows great potential on producing a switching device which can be applied in valley-based information processing.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A graphene-based valley filter, comprising:
    a bottom gate;
    a bilayer graphene deposited on the bottom gate, wherein the bilayer graphene comprises scattering defects; and
    two top gates deposited on the bilayer graphene, wherein the two top gates define a channel in the bilayer graphene, and the scattering defects are located in the vicinity of the channel;
    wherein a vertical electric field is applied between the bottom gate and the top gates to open a band gap as well as produce electronic energy subbands in the bilayer graphene channel, a transverse in-plane electric field is applied between the top gates to produce pseudospin splitting in the subbands of the bilayer graphene channel, the scattering defects are configured to produce a scattering between two energy valley states with opposite pseudospins in the bilayer graphene, couple subband states of opposite pseudospins and opens a pseudogap at a crossing point of the two subbands, and when a small bias is applied, electrons are driven to pass through the channel to become valley polarized in the bilayer graphene.

2. The device of claim 1, wherein the channel is in the form of a quantum wire or a nanoribbon.

3. The device of claim 1, wherein the scattering defects are formed by rough edges of the bilayer graphene in the vicinity of the channel.

4. The device of claim 1, wherein the scattering defects are formed by performing ion implantation to the bilayer graphene in the vicinity of the channel.

5. The device of claim 1, wherein the scattering defects are formed from graphene oxide in the vicinity of the channel.

6. The device of claim 1, wherein the bilayer graphene comprise a first layer and a second layer, the first layer is stacked on the second layer with a normal stacking distance, and the second layer is rotated with respect to the first layer by a specified angle.

7. The device of claim 1, further comprising an insulation layer deposited between the top gates and the bilayer graphene and between the bilayer graphene and the bottom gate.

8. The device of claim 1, wherein the vertical electric field is formed by applying a DC bias across the bottom gate and the top gates.

9. A graphene-based valley filter, comprising:
    a bottom gate;
    a boron nitride layer deposited on the bottom gate;

a monolayer graphene formed on the boron nitride layer, wherein the graphene layer comprises scattering defects; and two top gates formed on the graphene layer, wherein the two top gates define a channel in the graphene layer/boron nitride layer structure, and the scattering defects are located in the vicinity of the channel;

wherein a vertical electric field is applied between the bottom gate and the top gates to produce electronic energy subbands in the graphene layer, a transverse in-plane electric field is applied between the top gates to produce pseudospin splitting in the energy subbands of the graphene layer, the scattering defects are configured to produce a scattering between two energy valley states with opposite pseudospins in the graphene layer, couple subband states of opposite pseudospins and opens a pseudogap at a crossing point of the two subbands, and when a small bias is applied, electrons are driven to pass through the channel to become valley polarized in the graphene layer.

10. The device of claim 9, wherein the boron nitride layer is hexagonal.

11. The device of claim 9, wherein the graphene layer is stacked on the boron nitride layer with a normal stacking distance, and the graphene layer is rotated with respect to the boron nitride layer by a specified angle.

* * * * *